United States Patent [19]

Rajeevakumar et al.

[11] Patent Number: 4,638,462

[45] Date of Patent: Jan. 20, 1987

[54] SELF-TIMED PRECHARGE CIRCUIT

[75] Inventors: Thekkemadathil V. Rajeevakumar, Scarsdale; Lewis M. Terman, South Salem, both of N.Y.

[73] Assignee: International Business Machines Corporation, Armonk, N.Y.

[21] Appl. No.: 696,624

[22] Filed: Jan. 31, 1985

[51] Int. Cl.$^4$ .............................................. G11C 7/00
[52] U.S. Cl. .................................. 365/203; 365/230; 365/227
[58] Field of Search ............... 365/203, 230, 189, 227, 365/233; 307/269

[56] References Cited

U.S. PATENT DOCUMENTS

| | | | |
|---|---|---|---|
| 3,909,631 | 9/1975 | Kitagawa | 365/203 |
| 3,942,037 | 3/1976 | Mensch, Jr. | 307/518 |
| 3,942,162 | 3/1976 | Buchanan | 365/203 |
| 4,110,840 | 8/1978 | Abe et al. | 365/203 |
| 4,208,730 | 6/1980 | Dingwall et al. | 365/203 |
| 4,322,825 | 3/1982 | Nagami | 365/203 |
| 4,338,679 | 7/1982 | O'Toole | 365/203 |
| 4,355,377 | 10/1982 | Sud et al. | 365/203 |
| 4,539,661 | 9/1985 | Oritani | 365/230 |

FOREIGN PATENT DOCUMENTS

| | | | |
|---|---|---|---|
| 56-165983 | 12/1981 | Japan | 365/203 |
| 0040796 | 3/1982 | Japan | 365/203 |
| 0195387 | 12/1982 | Japan | 365/203 |

*Primary Examiner*—James W. Moffitt
*Assistant Examiner*—Glenn A. Gossage
*Attorney, Agent, or Firm*—John J. Goodwin

[57] ABSTRACT

A self-timed precharge circuit for a memory array consisting of an X-line complement circuit connected to the outputs of a plurality of falling edge detectors, and a precharge generator circuit connected to the output of the X-line complement circuit. Each falling edge detector is connected to a separate wordline (WL, WL+1, . . . WL+N) of the system memory array. In operation, the precharge generator circuit is triggered with a signal on the output lead from a falling edge detector which is activated when the selected wordline (WL, WL+1, . . . WL+N) connected thereto resets.

5 Claims, 5 Drawing Figures

FIG. 3
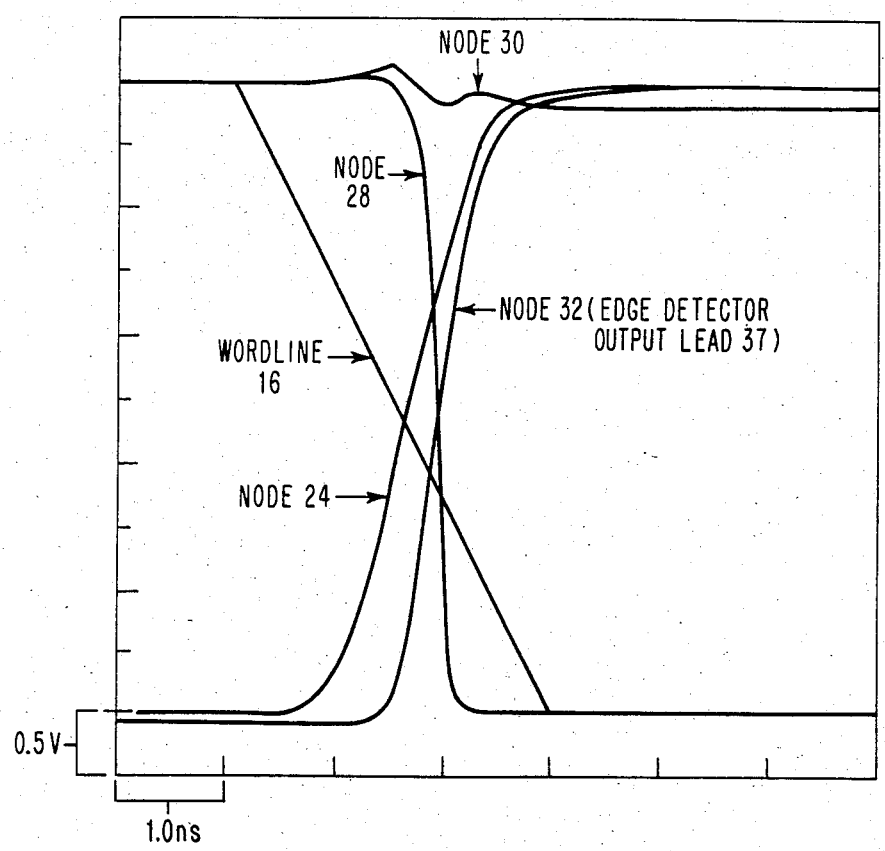
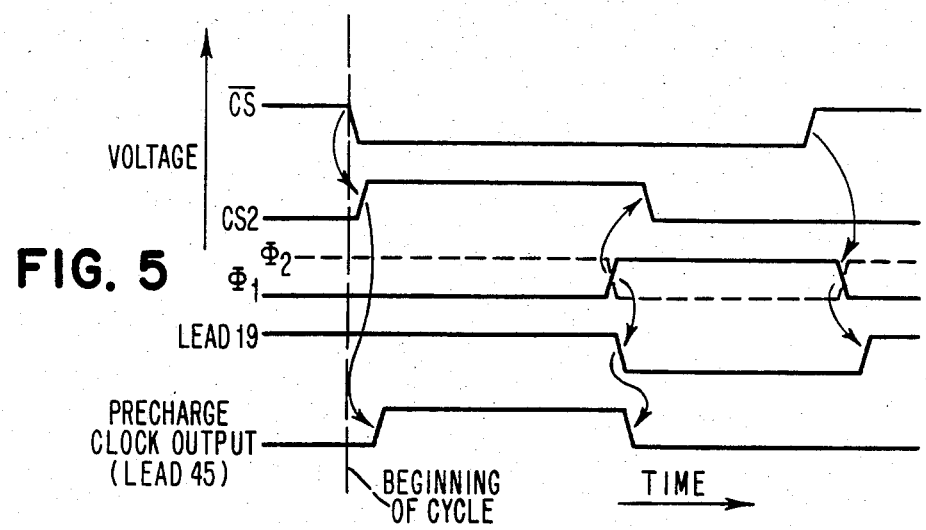
FIG. 5

SELF-TIMED PRECHARGE CIRCUIT

BACKGROUND OF THE INVENTION

1. Field of the Invention The present invention relates to precharge circuits, and more particularly, to a self-timed precharge circuit using a falling edge detector circuit to generate the precharge signal.

2. Description of the Prior Art

Various precharge circuits for memory arrays are known in the prior art. Representative prior art references are described hereinbelow.

In U.S. Pat. No. 4,208,730 issued June 17, 1980 to Dingwall et al entitled PRECHARGE CIRCUIT FOR MEMORY ARRAY, the bit lines of a word organized memory array are precharged to a potential which is substantially equal to the flip points of the memory cells of the array prior to each read and each write operation. This ensures the non-disturbance of the unselected memory cells of the array, provides greater design freedom of the memory array components, and enables the memory array to operate faster and more reliably.

In Japanese Patent No. 56-165983 issued Dec. 19, 1981 to Kiyobumi Ochii entitled SEMICONDUCTOR STORAGE DEVICE, a circuit is provided to enable high speed operation, by starting the precharge through the detection of change in the memory cycle at an address input transition detecting circuit and completing the precharge according to the bit line bit voltage. When any of the address input signals is changed, an input transition detecting circuit detects this and memory cells are turned on in response to the rise of a succeeding synchronizing control signal to start precharging of each bit line. The charging voltage of the lines is detected and when either one output is at 0, a circuit is set to complete the precharge. Thus, the precharge period is not made longer than required and high speed processing can be made for a semiconductor storage device.

In U.S. Pat. No. 4,338,679 issued Jul. 6, 1982 to O'Toole entitled ROW DRIVER CIRCUIT FOR SEMICONDUCTOR MEMORY, a circuit is disclosed for use in a semiconductor integrated circuit memory. The integrated circuit memory includes row lines which serve to activate access transistors for memory cells within the memory circuit. A row decoder circuit receives a plurality of first address bits and produces a drive signal output when the decoder circuit is selected. A transition detector circuit produces a transition signal whenever the state of any of the address bits is changed. A clock decoder receives a plurality of second address bits together with the transition signal to produce a selected clock signal. The combination of the transition signal and the output of the row decoder circuit serves to precharge the gate terminals of the row driver transistor for the row lines. The selected row line receives the active state of the clock signal which causes the gate terminal of the selected row driver transistor to be capacitively coupled to a higher voltage than the clock signal to therefore supply the full clock signal voltage to the row line. The voltage on the row line then activates the access transistors for the memory cells on the row line. This enable a maximum charge to be stored in or read from the memory cell.

In U.S. Pat. No. 4,355,377 issued Oct. 19, 1982 to Sud et al entitled ASYNCHRONOUSLY EQUILLIBRATED ND PRE-CHARGED STATIC RAM, a static random access memory is described wherein fully asynchronous active equilibration and precharging of the RAM's bit lines provides improved memory access time and lower active power dissipation. Each change in the memory's row address is sensed for developing a clock pulse of a controlled duration. The clock pulse is received by a group of equilibrating transistors and a group of precharging transistors which are coupled to the memory's bit lines. When the clock pulse occurs to effect simultaneous equilibration and pre-charging of the bit lines.

In U.S. Pat. No. 3,942,037 issued Mar. 2, 1976 to Mensch, Jr. entitled MOS EDGE SENSING CIRCUIT, an edge sensing circuit is implemented using MOS logic gates. The edge sense circuit detects either a positive transition or a negative transistion of a first input signal depending on the logic level of a second input signal, if an enable signal logical "1" is applied to the edge sense circuit. If the enable signal is at a logical "0", however, a level, rather than a transition, of the input signal is detected.

U.S. Pat. No. 3,909,631 issued Sept. 30, 1975 to Kitagawa entitled PRE-CHARGE VOLTAGE GENERATING SYSTEM relates to a precharge voltage generator for use in an MOS memory matrix device wherein a voltage is generated which is midway between the voltage stored designating a logical 1 and a logical 0. This voltage is constantly variable to track changes in $V_{DD}$ and $V_T$ during circuit operation to provide the desired midvoltage level and thereby allow accurate recognition of logic levels.

Other references to be noted include U.S. Pat. No. 4,322,825 issued Mar. 30, 1982 to Nagami entitled FLEXIBLE HIDDEN REFRESH MEMORY CIRCUIT and U.S. Pat. No. 4,110,840 issued Aug. 29, 1978 to Abe et al entitled SENSE LINE CHARGING SYSTEM FOR RANDOM ACCESS MEMORY.

The present invention differs from the prior art in that it incorporates the concept of a selftimed precharge circuit using a novel falling edge detector scheme to generate the precharge signal for high-performance CMOS RAMs. The advantages of the proposed circuit compared to other precharge circuits include the fact that by employing such a falling edge detector means, the precharge signal is guaranteed not to be generated before the wordline has reset. Also minimal dc power is dissipated, and the timing skews that would result if a separate timing chain was used are entirely eliminated.

SUMMARY OF THE INVENTION

An object of the present invention is to provide an improved means for triggering precharge circuits for memory arrays.

Another object of the present invention is to provide a self-timed precharge circuit using a novel falling edge detector technique to generate the precharge signal.

A further object of the present invention is to provide an improved precharge circuit for CMOS RAMs which uses minimal dc power, eliminates timing skews and includes its own clock circuit.

The foregoing and other objects, features and advantages of the invention will be apparent from the following more particular description of the invention as illustrated in the accompanying drawings.

BRIEF DESCRIPTION OF THE INVENTION

FIG. 3 illustrates curves of voltage vs time useful in explaining the operation of the precharge circuit of the present invention.

FIG. 5 is an illustration of curves of input signal, output signal and clock signals useful in explaining the circuit of FIG. 4.

DESCRIPTION OF THE INVENTION

Figure 1:
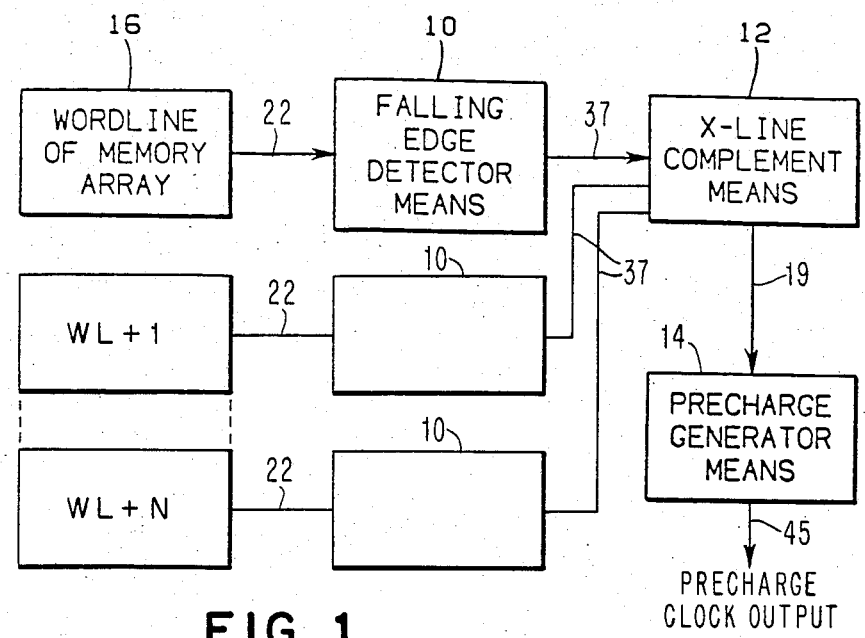
FIG. 1 is a block diagram showing the precharge circuit of the present invention in combination with other elements of a memory array.

Referring to FIG. 1, a block diagram illustrating the concept of the self-timed precharge circuit of the present invention is shown. The circuit consists of an X-line complement means 12 connected to the outputs of a plurality of falling edge detector means 10, and a precharge generator means 14. Each falling edge detector means 10 is connected to a separate wordline (WL, WL+1, ... WL+N) of the system memory array. In operation, the precharge generator means 14 is triggered from a signal on line 19 from X-line complement means 12, which is triggered by a signal on lead 37 from one of the multiplicity of falling edge detector circuits 10 which is activated when the selected wordline (WL, WL+1, ... WL+N) connected thereto resets.

Figure 2:
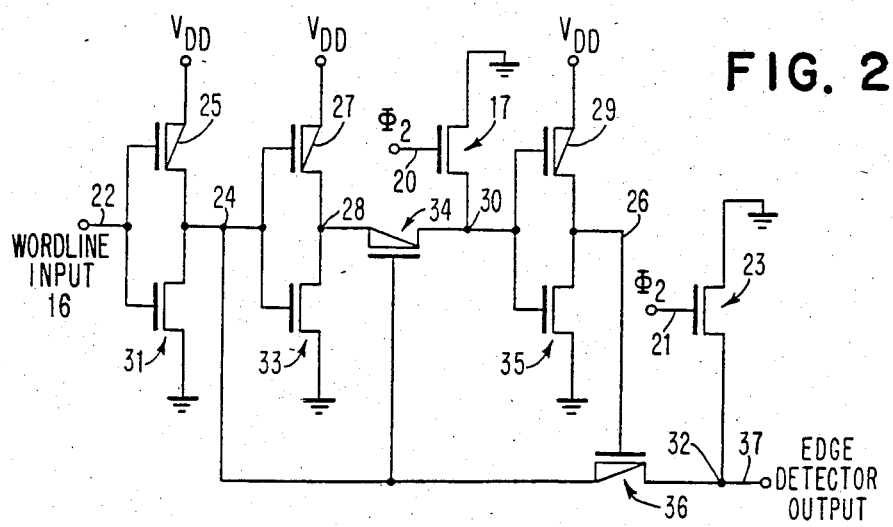
FIG. 2 is a schematic drawing illustrating an edge detector circuit which may be incorporated in the precharge circuit according to the principles of the present invention.

A schematic circuit illustration of the edge detector means 10 is shown in FIG. 2. Transistor devices 25, 27, 29, 34 and 36 illustrated with slant lines are p-channel MOSFET devices whereas transistor devices 17, 23, 31, 33 and 35 are n-channel MOSFET devices. A reset signal, $\Phi_2$, is applied on lead 20 and lead 21. At the beginning of a cycle, the input wordline on lead 22 is low and reset signal $\Phi_2$ on leads 20 and 21 is high. Nodes 24 and 26 are high and node 28 is low. Nodes 30 and 32 are precharged low. The detector circuit is initiated by reset signal $\Phi_2$ going low, turning off the associated n-channel MOSFET devices 17 and 23. Now when the wordline input 16 on lead 22 goes high, node 24 goes low resulting in node 28 going high and p-channel device 34 turning on. This results in node 30 being pulled high and thus node 26 goes low. Node 26 going low turns on device 36, keeping node 32 and output lead 37 (the edge detector output) low.

When the wordline input 16 on lead 22 then goes low, node 24 goes high turning off p-channel device 34 and thereby keeping node 30 high. Node 26 remains low and p-channel device 36 remains on. Thus, the edge detector output at node 32 and output lead 37 gets charged up to $V_{DD}$ from node 24 through device 36. Near the end of the cycle, reset signal $\Phi_2$ on leads 20 and 21 goes high, nodes 30 and 32 and output lead 37 are once again precharged low and the circuit is ready for a new cycle.

FIG. 3 illustrates curves of the variation of voltage at various waveforms with time at selected points of the circuit of FIG. 2 during the operation of the falling edge detector means 10. When the input wordline 16, shown in FIG. 3 falls, the output of the falling edge detector at node 32 and output lead 37 go high. Typical waveforms of the internal nodes 24, 28, and 30 are also shown. Note that node 30 stores the high-voltage state and is only lightly perturbed when node 28 is discharged to a low.

Figure 4:
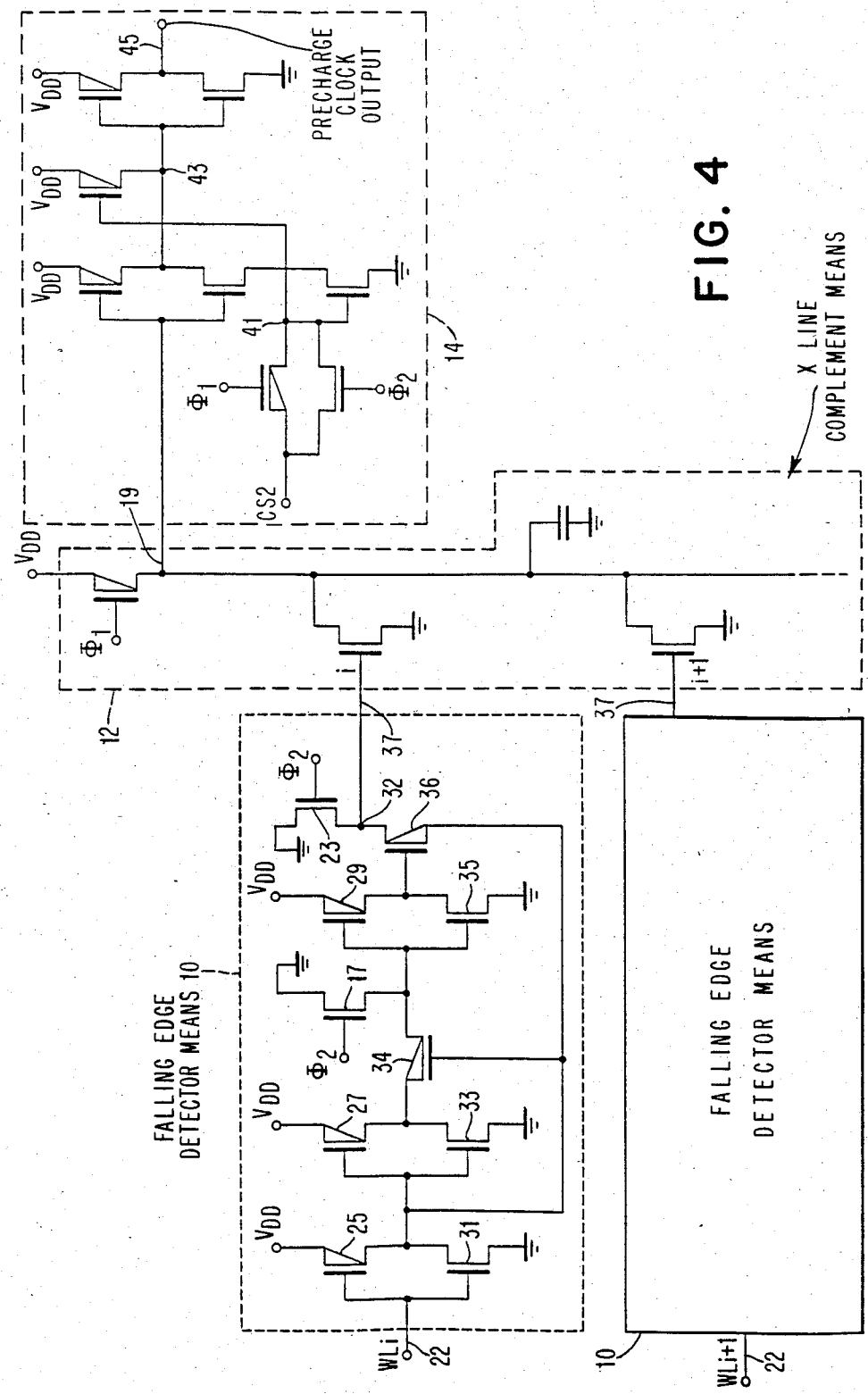
FIG. 4 is a schematic illustration of the precharge circuit of the present invention including an edge detector circuit, an X-line complement circuit and a precharge generator.

The complete precharge clock generation means, which includes the edge detectors 10, X-line complement 12, and precharge clock generator 14, is shown schematically in FIG. 4. FIG. 5 shows the timing of the X-line complement means output on lead 19, the precharge clock output on lead 45, system chip select not signal $\overline{CS}$, internal chip select signal CS2 and reset signal $\Phi_1$. An edge detector means 10, such as shown in FIG. 2, is associated with each wordline (WL, WL+1, ... WL+N). The outputs of all the falling edge detectors on leads 37 in FIG. 4 are NORed to form the X-line complement circuit 12. The X-line complement output signal on lead 19 and the internal chip select (CS2) signal are NANDed and the signal node 43 is inverted by the two devices connected between node 43 and output lead 45 to form the precharge clock generator means 14.

At the beginning of the cycle of operation, all outputs on leads 37 of the falling edge detector means 10 are low. Reset signal $\Phi_1$, is low and its complement signal $\Phi_2$, is high. Chip select signal CS2, derived from chip select not signal $\overline{CS}$, is low. Thus, the output signal from the X-line complement means 12 on lead 19 is high. The signal at node 41 of precharge generator means 14 is low and the signal at node 43 is high. The precharge clock output signal on lead 45 from precharge generator means 14 is low.

During the cycle of operation, which is started or triggered by the system chip select not signal $\overline{CS}$ going low followed by CS2 derived therefrom going high, node 41 going high and the precharge clock output signal on lead 45 goes high. After access to valid data has been completed, reset signal $\Phi_1$ goes high to $V_{DD}$ and reset signal $\Phi_2$ is discharged to ground. This keeps node 41 of the precharge generator means 14 high.

Then the wordline access goes on and a selected wordline 16 goes high and all output leads 37 from all the falling edge detector means 10 stay low. When the selected wordline 16 goes low, the particular falling edge detector means 10 connected thereto responds to the falling signal ("falling edge") and the output signal on its output lead 37 goes high, as described previously. This results in the output from X-line complement means 12 on lead 19 going low. Node 43 of precharge generator means 14 goes high and, therefore, the precharge clock output signal on lead 45 goes low, initiating the precharge cycle. Later, near the end of the cycle, reset signal $\Phi_1$ is discharged low and its complement $\Phi_2$ goes high so that the circuit is precharged and ready for the next cycle.

It should be noted that even if the internal chip select signal CS2 goes low before the selected wordline resets, the precharge clock output signal on lead 45 does not go low until the selected wordline has reset.

It should be further noted that the "high" and "low" signal states referred to herein are relative, and correspond to the p-channel and n-channel devices shown in the specific embodiment. If the p and n conductivities of the device were reversed, the signal states would be "low" and "high" accordingly as evident to one skilled in the art. What has been described is a self-timed precharge generation circuit which is fast and extremely reliable, is free of any timing skew problems, and fits well with the existing architecture of the state of the art random access memories.

Having thus described out invention, what we claim as new, and desire to secure as Letter Patent is:

1. A circuit for generating a precharge clock output signal in response to a memory array wordline signal resetting from a high to a low signal state comprising
   a first reset signal and a second reset signal which is the complement of said first reset signal,
   a plurality of identical falling edge detector means, each of said falling edge detector means connected to a separate memory array wordline, each of said falling edge detector means responsive to a signal change on an associated wordline from a high to a low signal state for producing an output signal which changes from a low to a high signal state in response to said wordline high to low signal change,
   each of said falling edge detector means including first and second switching devices connected respectively between first and second nodes and a voltage supply equal to a low signal state level, said first and second switching devices being turned off by said second reset signal, placing said first node at a high signal state and said second node at a low signal state when said wordline signal to said falling edge detector changes from said low to said high signal state, and
   further including a falling edge detector output lead connected to said second node and wherein said signal thereon is said falling edge detector output signal,
   an X-line complement inverter means connected to the outputs of all of said plurality of falling edge detector means for producing an output signal which changes from a high signal state to a low signal state in response to a low to high output signal change from any of said plurality of falling edge detector means, and
   a precharge generator means connected to the output of said X-line complement means for producing a precharge clock output signal only in response to said high to low signal state change from said X-line complement means, said precharge clock output signal, therefore, also being produced only in response to said high to low signal state change on a wordline.

2. A circuit for generating a precharge clock output signal according to claim 1 wherein, when said wordline signal changes from said high to said low signal state, said second reset signal remains at said low signal state, said first node remains at said high signal state, and said second node rises from said low to said high signal state, thus, providing said low to high signal state output signal change from said falling edge detector in response to said wordline high to low signal change.

3. A circuit for generating a precharge clock output signal according to claim 1 wherein, said falling edge detector means further includes a a third node and a third switching device connected between said second and third node, wherein, when said wordline signal changes from said low to said high state placing said first node at said high signal state, said third node changes from a high signal state to a low signal state, thereby turning said third switching device on and placing said second node at said low signal state, and
   wherein, when said wordline signal changes from said high to said low state and said first node remains at said high signal state, said third node remains at said low signal state and said third transistor device remains on such that said second node changes from said low signal state to said high signal state.

4. A circuit for generating a precharge clock output signal according to claim 1 wherein said X-line complement inverter means is a NOR circuit connected to said first reset signal, and including a plurality of switching devices connected respectively to each of said output leads of said plurality of falling edge detector means and responsive to said output signals thereon which change from a low to a high signal state for producing said output signal which changes from a high to a low signal state.

5. A circuit for generating a precharge clock output signal according to claim 4 wherein said precharge generator means includes a first node connected through a first switching means to the said output of said X-line complement inverter means and through a second switching means to said first and second reset signals, said first node of said precharge generator means changing from a low to a high signal state when said output signal from said X-line complement inverter means changes from a high to a low state and said reset signal is present, and
   wherein said precharge clock output signal changes from a high to a low signal state in response to said first node of said precharge generator means changing from a low to a high signal state, said precharge clock output signal going to said low signal state only when said wordline resets.

* * * * *